United States Patent
Ausserlechner

(10) Patent No.: US 10,355,197 B2
(45) Date of Patent: Jul. 16, 2019

(54) INTEGRATED CIRCUIT INCLUDING SENSOR HAVING INJECTION MOLDED MAGNETIC MATERIALS HAVING DIFFERENT MAGNETIC REMANENCES

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 166 days.

(21) Appl. No.: 15/688,195

(22) Filed: Aug. 28, 2017

(65) Prior Publication Data
US 2017/0358735 A1    Dec. 14, 2017

Related U.S. Application Data

(60) Division of application No. 14/093,462, filed on Nov. 30, 2013, now Pat. No. 9,812,636, which is a
(Continued)

(51) Int. Cl.
*H01L 43/02* (2006.01)
*H01L 43/12* (2006.01)
(Continued)

(52) U.S. Cl.
CPC ............ *H01L 43/02* (2013.01); *G01R 33/072* (2013.01); *H01L 43/12* (2013.01); *H01L 43/00* (2013.01);
(Continued)

(58) Field of Classification Search
CPC . G01B 7/02; G01B 7/023; G01B 7/04; G01B 7/046; G01B 7/14; G01B 7/305; G01B 7/31; G01B 7/312; G01B 7/30; H01L 43/00; H01L 43/06; H01L 43/08; H01L 43/12; H01L 43/02; H01L 2224/48091; H01L 2224/73264; H01L 2224/49171; H01L 2224/32245; H01L 2224/48247; H01L 2224/48472; G01R 33/0094;
(Continued)

(56) References Cited

U.S. PATENT DOCUMENTS 3,146,317 A    8/1964   Kuhrt et al.
3,547,871 A    12/1970  Hofman
(Continued)

FOREIGN PATENT DOCUMENTS

DE    3243039 A1    5/1984
DE    4445120 A1    6/1995
(Continued)

OTHER PUBLICATIONS

Machine English translation of the description of JP2004294070, obtained on Feb. 20, 2018, obtained from the EPO patent website (https://worldwide.espacenet.com/advancedSearch?locale=en_ep).*
(Continued)

*Primary Examiner* — Patrick Assouad
*Assistant Examiner* — Haidong Zhang
(74) *Attorney, Agent, or Firm* — Schiff Hardin LLP

(57) ABSTRACT

An integrated circuit includes a magnetic field sensor and an injection molded magnetic material enclosing at least a portion of the magnetic field sensor.

20 Claims, 8 Drawing Sheets

US 10,355,197 B2

Page 2

Related U.S. Application Data continuation of application No. 13/594,974, filed on Aug. 27, 2012, now Pat. No. 9,559,293, which is a continuation of application No. 11/950,050, filed on Dec. 4, 2007, now Pat. No. 8,587,297.

(51) Int. Cl.
    *G01R 33/07*     (2006.01)
    *H01L 43/00*     (2006.01)

(52) U.S. Cl.
    CPC ............ *H01L 2224/32245* (2013.01); *H01L 2224/48091* (2013.01); *H01L 2224/48247* (2013.01); *H01L 2224/48472* (2013.01); *H01L 2224/49171* (2013.01); *H01L 2224/73265* (2013.01); *Y10T 29/49121* (2015.01); *Y10T 29/49158* (2015.01)

(58) Field of Classification Search
    CPC .... G01R 33/07; G01R 33/072; G01R 33/075; G01R 33/077; G01R 33/06; G01R 33/09; G01R 33/091; G01R 33/093; G01R 33/095; G01R 33/096; G01R 33/098; G01R 15/205; G01R 15/20; G01D 5/145; G01D 5/14; G01D 5/142; G01D 5/147; G01D 5/16; G01D 5/20; G01D 5/2006; G01D 5/2013; G01D 5/202; G01D 5/2026; G01D 5/2033; G01D 5/204; G01D 5/2046; G01D 5/2053; G01D 5/206; G01D 5/22; G01D 5/2208; G01D 5/2216; G01D 5/2225; G01D 5/2233; G01D 5/2241; G01D 5/225; G01D 5/2258; G01D 5/2266; G01D 5/2275; G01D 5/2283; Y10T 29/49; Y10T 29/49002; Y10T 29/49158; Y10T 29/49121

See application file for complete search history.

(56) References Cited

U.S. PATENT DOCUMENTS

| | | | |
|---|---|---|---|
| 4,021,767 A * | 5/1977 | Nonaka | H01L 43/04 257/421 |
| 4,048,670 A * | 9/1977 | Eysermans | H01L 43/04 174/528 |
| 4,188,605 A | 2/1980 | Stout | |
| 4,496,303 A | 1/1985 | Loubier | |
| 4,785,242 A | 11/1988 | Vaidya et al. | |
| 4,905,318 A | 2/1990 | Fukuda et al. | |
| 5,210,489 A | 5/1993 | Petersen | |
| 5,260,653 A | 11/1993 | Smith et al. | |
| 5,300,883 A * | 4/1994 | Richeson | G01D 5/145 324/207.2 |
| 5,354,939 A | 10/1994 | Hollstein et al. | |
| 5,581,179 A | 12/1996 | Engel et al. | |
| 5,631,557 A | 5/1997 | Davidson | |
| 5,637,995 A | 6/1997 | Izawa et al. | |
| 5,781,005 A | 7/1998 | Vig et al. | |
| 5,801,529 A | 9/1998 | Umemoto et al. | |
| 5,888,416 A | 3/1999 | Ikuma et al. | |
| 5,936,400 A | 8/1999 | Tchertkov et al. | |
| 5,963,028 A | 10/1999 | Engel et al. | |
| 5,998,989 A | 12/1999 | Lohberg | |
| 6,063,322 A | 5/2000 | Draxler et al. | |
| 6,107,793 A | 8/2000 | Yokotani et al. | |
| 6,169,396 B1 | 1/2001 | Yokotani et al. | |
| 6,265,865 B1 | 7/2001 | Engel et al. | |
| 6,278,270 B1 | 8/2001 | Robles-Flores et al. | |
| 6,400,143 B1 | 6/2002 | Travostino et al. | |
| 6,818,478 B1 | 11/2004 | Wolf | |
| 6,891,368 B2 | 5/2005 | Kawano et al. | |
| 6,949,386 B2 | 9/2005 | Piguet et al. | |
| 7,112,955 B2 | 9/2006 | Buchhold | |
| 7,119,419 B2 | 10/2006 | Kato et al. | |
| 7,129,691 B2 | 10/2006 | Shibahara et al. | |
| 7,250,760 B2 | 7/2007 | Ao | |
| 7,301,331 B2 | 11/2007 | Kurumado | |
| 7,375,516 B2 | 5/2008 | Takenaga et al. | |
| 7,382,122 B2 | 6/2008 | Komatsu et al. | |
| 7,391,203 B2 | 6/2008 | Modest | |
| 7,400,143 B2 | 7/2008 | Hayashi et al. | |
| 7,548,060 B2 | 6/2009 | Herrmann et al. | |
| 7,777,309 B2 | 8/2010 | Danno et al. | |
| 8,058,870 B2 | 11/2011 | Sterling | |
| 8,174,256 B2 | 5/2012 | Sterling | |
| 8,587,297 B2 | 11/2013 | Ausserlechner | |
| 8,610,430 B2 | 12/2013 | Werth et al. | |
| 2002/0105322 A1 | 8/2002 | Schroeder et al. | |
| 2003/0222642 A1 | 12/2003 | Butzmann | |
| 2004/0174164 A1 | 9/2004 | Ao | |
| 2005/0146052 A1 | 7/2005 | Sakamoto et al. | |
| 2005/0146323 A1 | 7/2005 | Kleinen et al. | |
| 2005/0173721 A1 | 8/2005 | Isoda | |
| 2006/0022670 A1 | 2/2006 | Kumar et al. | |
| 2006/0164388 A1 | 7/2006 | Akieda et al. | |
| 2006/0169361 A1 | 8/2006 | Hasegawa et al. | |
| 2006/0261801 A1 | 11/2006 | Busch | |
| 2006/0279280 A1 | 12/2006 | Minamitani et al. | |
| 2007/0001664 A1 | 1/2007 | Steinbrink et al. | |
| 2007/0018642 A1 | 1/2007 | Ao | |
| 2007/0063693 A1 | 3/2007 | Modest | |
| 2007/0075705 A1 | 4/2007 | Kurumado | |
| 2007/0077732 A1 | 4/2007 | Ito et al. | |
| 2007/0145972 A1 | 6/2007 | Auburger et al. | |
| 2007/0284684 A1 | 12/2007 | Naito et al. | |
| 2008/0116884 A1 | 5/2008 | Rettig et al. | |
| 2008/0204007 A1 | 8/2008 | Kim et al. | |
| 2008/0308886 A1 | 12/2008 | Ausserlechner et al. | |
| 2009/0201014 A1 * | 8/2009 | Cavallo | B62K 23/04 324/207.25 |
| 2009/0243595 A1 | 10/2009 | Theuss et al. | |
| 2010/0330708 A1 | 12/2010 | Engel et al. | |
| 2012/0319682 A1 | 12/2012 | Ausserlechner | |

FOREIGN PATENT DOCUMENTS

| | | |
|---|---|---|
| DE | 19849613 A1 | 5/2000 |
| DE | 10123513 A1 | 3/2003 |
| DE | 10141371 A1 | 3/2003 |
| DE | 102004063539 A1 | 9/2005 |
| EP | 0844487 A2 | 7/1983 |
| EP | 0357200 A2 | 3/1990 |
| EP | 0464892 A2 | 1/1992 |
| EP | 0772046 A2 | 5/1997 |
| EP | 1182461 A2 | 2/2002 |
| JP | 60223095 A | 11/1985 |
| JP | 63084176 A | 4/1988 |
| JP | 09079865 A | 3/1997 |
| JP | 11087797 A | 3/1999 |
| JP | 2000292203 A | 10/2000 |
| JP | 2000298134 A | 10/2000 |
| JP | 2002286765 A | 10/2002 |
| JP | 2004294070 A | 10/2004 |
| WO | WO-03040659 A1 | 5/2003 |
| WO | WO-03040660 A1 | 5/2003 |

OTHER PUBLICATIONS

"Magnet", Wikipedia, 2011 (1pg).
"Bar Magnet", Hyperphysics, 2011 (3pgs).
R.S. Popovic, et al., "Integrated Hall-Effect Magnetic Sensors", Department of Microengineering, EPFL, Swiss Federal Institute of Technology. CH-1015 Lausanne, Switzerland, 6 pgs. 2001. D Sensors and Actuators A 91 (2001) 46-50.
R.S. Popovic, "Not-Plate-Like Hall Magnetic Sensors and their Applications", Swiss Federal Institute of Technology, Lausanne, Room INR 137, CH-1015 Lausanne EPFL, Switzerland, 10 pgs. 2000. D Sensors and Actuators 85 (2000) 9-17.

(56) References Cited

OTHER PUBLICATIONS

Paul Leroy, et al., Optimization of the Shape of Magnetic Field Concentrators to Improve the Sensitivity of Hall Sensors., Technisches Messen 73, 12 pgs. 2006.
Hung, et al., "Effects of Additives on the Orientation and Strength of Plastic Ferrite Magnet", IEEE Trans. Magn. vol. 25, No. 5, Sep. 1989, pp. 3287-3289.
English machine translation of the detailed description of JP 11-087797 A, obtained on Jun. 18, 2011 from the JPO website.
English machine translation of the claims and detailed description of JP 2004294070 A, Yamada, obtained on Apr. 17, 2010.
English machine translation of the claims and detailed description of JP 2000292203 A, Ito et al., obtained on Apr. 17, 2010.
Machine English translation of the detailed description and claims of JP9-79865, obtained from the Japanese Patent Office website, obtained on Sep. 19, 2015.
Dictionary definition of the term "enclose" obtained from Dictionary.com (http://dictionary.reference.com/browse/enclose?s=t), obtained on Feb. 29, 2016.

\* cited by examiner

INTEGRATED CIRCUIT INCLUDING SENSOR HAVING INJECTION MOLDED MAGNETIC MATERIALS HAVING DIFFERENT MAGNETIC REMANENCES

REFERENCE TO RELATED APPLICATIONS

This application is a divisional patent application of U.S. patent application Ser. No. 14/093,462, filed on Nov. 30, 2013, which is a continuation of U.S. patent application Ser. No. 13/594,974, filed on Aug. 27, 2012, now U.S. Pat. No. 9,559,293, which is a continuation of U.S. patent application Ser. No. 11/950,050, filed on Dec. 4, 2007, now U.S. Pat. No. 8,587,297, each of which is incorporated herein by reference in its entirety.

BACKGROUND

Magnetic field sensors are used in a variety of applications for sensing the rotation of a wheel and/or shaft, such as in anti-lock braking systems, crank-shaft sensors, cam-shaft sensors, etc. Magnetic field sensors are also used for sensing vertical and/or angular movement. Typically, a permanent magnet is attached to the back side of a magnetic field sensor package, which is placed in front of a magnetically permeable tooth wheel. The rotation of the tooth wheel generates a sinusoidally varying magnetic field on the magnetic field sensor. Magneto-resistive (XMR) sensor elements within the magnetic field sensor package detect the component of the magnetic field that is parallel to the surface of the magnetic field sensor package and that points in the direction of the movement of the tooth wheel (i.e., the tangential direction). The detected magnetic field variation provides information about the angular position and rotational speed of the tooth wheel.

The permanent magnet attached to the back side of the magnetic field sensor package has a number of disadvantages. First, the permanent magnet has position tolerances with respect to the magnetic field sensor package since the permanent magnet is typically attached after the completion of the fabrication of the magnetic field sensor package. Second, the glue used to attach the permanent magnet to the magnetic field sensor has to be selected carefully since the sensor assembly is typically exposed to a wide temperature range (e.g., −50° C. to −180° C.).

Third, the permanent magnet is typically attached to the magnetic field sensor package by someone other than the semiconductor manufacturer who fabricated the magnetic field sensor package. Therefore, the permanent magnet is attached to the magnetic field sensor package after the final test of the magnetic field sensor package at the semiconductor manufacturer. The semiconductor manufacturer typically tests the magnetic field sensor package at several temperatures. Thus, the permanent magnet is typically not tested at several temperatures since the thermal mass of the entire sensor assembly is usually too large to perform an economical multi-temperature test.

Fourth, the permanent magnet is typically magnetized after it is attached to the magnetic field sensor package using a large magnetization field. Due to the large magnetization field, there is a risk that the sensor performance will be degraded. This sensor performance degradation is typically not detected before delivery of the sensor. Often, one or more of the pins of the magnetic field sensor package are inaccessible once the entire sensor assembly is fabricated, thus preventing the activation of test modes of the sensor. Finally, for some XMR sensors, such as giant magneto-resistive (GMR) sensors, a typical permanent magnet produces diverging magnetic field or flux lines. The diverging flux lines may drive the XMR sensors into saturation.

SUMMARY

One embodiment provides an integrated circuit. The integrated circuit includes a magnetic field sensor and an injection molded magnetic material enclosing at least a portion of the magnetic field sensor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
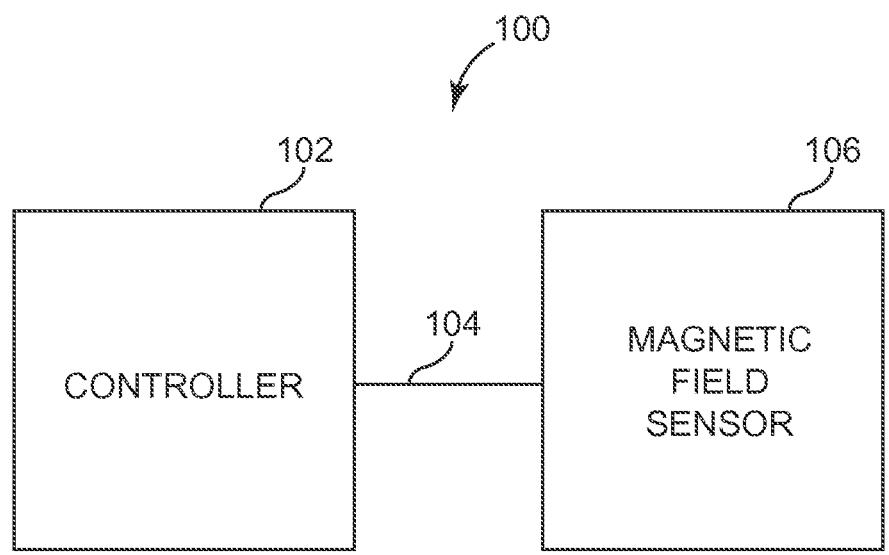
FIG. 1 is a block diagram illustrating one embodiment of a system.

FIG. 1 is a block diagram illustrating one embodiment of a system 100. System 100 includes a controller 102 and a magnetic field sensor 106. In one embodiment, magnetic field sensor 106 is used in an automobile for sensing the rotation of a wheel and/or shaft, such as in anti-lock braking systems, crank-shaft sensors, cam-shaft sensors, etc. In another embodiment, magnetic field sensor 106 is used for sensing vertical and/or angular movement.

Controller 102 is electrically coupled to magnetic field sensor 106 through signal path 104. Controller 102 includes a microprocessor, microcontroller, or other suitable logic circuitry for controlling the operation of magnetic field sensor 106. In one embodiment, controller 102 receives sensor signals from magnetic field sensor 106 indicating components of a magnetic field sensed by magnetic field sensor 106.

Magnetic field sensor 106 includes hall sensor elements, magneto-resistive (XMR) sensor elements, such as anisotropic magneto-resistive (AMR) sensor elements, giant magneto-resistive (GMR) sensor elements, tunnel magneto-resistive (TMR) sensor elements, or other suitable magnetic field sensitive elements. In one embodiment, magnetic field sensor 106 includes a package including an injection molded magnetic material. In another embodiment, magnetic field sensor 106 includes a package including both an injection molded plastic material and an injection molded magnetic material. The injection molded magnetic material replaces the permanent magnet used in typical magnetic field sensors.

Figure 2:
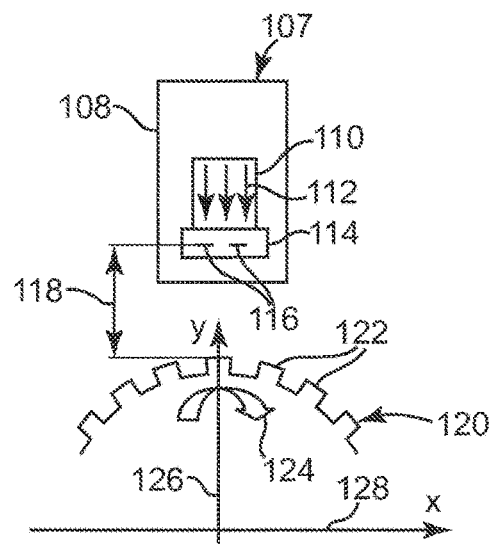
FIG. 2 is a diagram illustrating one embodiment of a magnetic field sensor.

FIG. 2 is a diagram illustrating one embodiment of a magnetic field sensor 107. In one embodiment, magnetic field sensor 107 provides magnetic field sensor 106 previously described and illustrated with reference to FIG. 1. In one embodiment, magnetic field sensor 107 is an integrated circuit or part of an integrated circuit. Magnetic field sensor 107 includes a protective cover 108, a magnet 110, and a magnetic field sensor package 114 including a die with magnetic field sensitive elements 116 and a mold body.

Magnetic field sensitive elements 116 are fabricated in magnetic field sensor package 114. Magnetic field sensitive elements 116 include hall sensor elements, XMR sensor elements, or other suitable magnetic field sensitive elements. Magnet 110 contacts the back side of magnetic field sensor package 114. Magnet 110 is magnetized perpendicular to magnetic field sensor package 114 as indicated by arrows 112. Magnet 110 and magnetic field sensor package 114 are enclosed by protective cover 108.

In one embodiment, magnetic field sensor 107 is placed near a permeable tooth wheel 120 including a plurality of teeth 122. Magnetic field sensor 107 and permeable tooth wheel 120 are oriented to each other in the y-direction 126 to provide a suitable magnetic or effective air gap 118 between magnetic field sensitive elements 116 and teeth 122 of permeable tooth wheel 120. As the magnetic air gap 118 is increased, the amplitude of the signal from magnetic field sensor 107 decreases.

In operation, permeable tooth wheel 120 rotates as indicated at 124. In response to the rotation of permeable tooth wheel 120, permeable tooth wheel 120 generates a sinusoidally varying magnetic field on magnetic field sensor 107. Magnetic field sensitive elements 116 detect the component of the magnetic field that is parallel to the surface of magnetic field sensor package 114 (i.e., the component of the magnetic field in the negative or positive x-direction 128). The variation in the detected magnetic field provides information about the angular position and rotational speed of permeable tooth wheel 120. In another embodiment, magnetic field sensitive elements 116 detect the component of the magnetic field that is perpendicular to the surface of magnetic field sensor package 114 (i.e., the component of the magnetic field in the negative or positive y-direction 126).

Figure 3A:
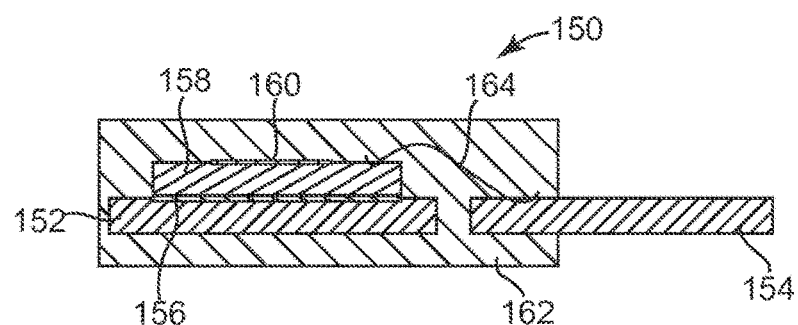
FIG. 3A illustrates a cross-sectional view of one embodiment of a magnetic field sensor.
Figure 3B:
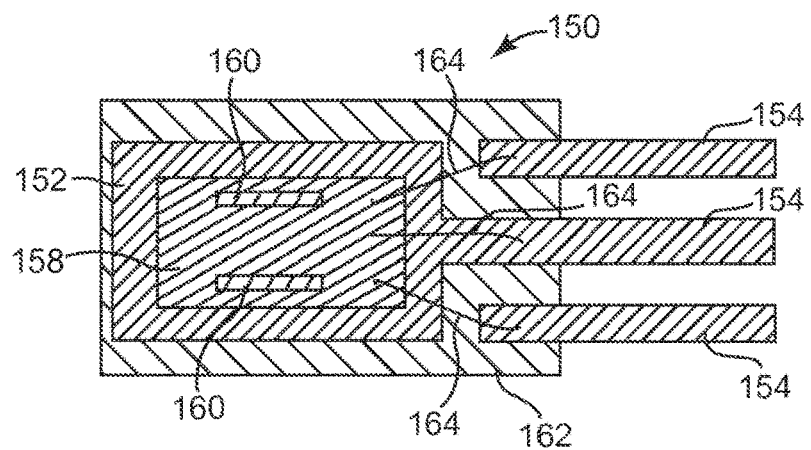
FIG. 3B illustrates a top view of one embodiment of a magnetic field sensor.

FIG. 3A illustrates a cross-sectional view and FIG. 3B illustrates a top view of one embodiment of a magnetic field sensor 150. In one embodiment, magnetic field sensor 150 provides magnetic field sensor 106 previously described and illustrated with reference to FIG. 1. In one embodiment, magnetic field sensor 150 is configured to be used with a permeable tooth wheel, such as permeable tooth wheel 120 previously described and illustrated with reference to FIG. 2. In one embodiment, magnetic field sensor 150 is an integrated circuit or part of an integrated circuit.

Magnetic field sensor 150 includes a leadframe 152, pins 154, a magnetic field sensor die 158 including magnetic field sensitive elements 160, bond wires 164, and injection molded magnetic material 162. Magnetic field sensitive elements 160 are fabricated in magnetic field sensor die 158. In one embodiment, magnetic field sensitive elements 160 are formed on the surface of magnetic field sensor die 158. Magnetic field sensitive elements 160 include hall sensor elements, XMR sensor elements, or other suitable magnetic field sensitive elements. Magnetic field sensor die 158 is attached to leadframe 152 through die bond 156. Magnetic field sensor die 158 is electrically coupled to pins 154 through bond wires 164.

Injection molded magnetic material 162 encloses leadframe 152, magnetic field sensor die 158, bond wires 164, and portions of pins 154. Injection molded magnetic material 162 provides a plastic bonded magnet. To provide a plastic bonded magnet, a permanent magnet material, such as a hard ferrite material with Ba or Sr, a rare earth material (e.g., NdFeB, $Sm_2Co_{17}$), or other suitable magnetic material is ground to a fine powder. In one embodiment, the fine powder has a grain size within the range of approximately 1 μm-10 μm. The fine powder is mixed with an epoxy binder such as a poly-amide (PA), poly-phenylen-sulfide (PPS), or other suitable epoxy binder. In one embodiment, the mixture includes about 60% by volume of magnetic material. In other embodiments, other suitable percentages of magnetic material suitable for injection molding are used. The mixture is injected into a cavity formed around leadframe 152, magnetic field sensor die 158, bond wires 164, and portions of pins 154 to provide injection molded magnetic material 162.

In one embodiment, injection molded magnetic material 162 extends substantially an equal amount both above and below the assembly formed by magnetic field sensor die 158 and leadframe 152. By having magnetic material both above and below the assembly, the magnetic field or flux lines pass substantially straight through the assembly. The substantially straight flux lines reduce the x-component magnetic field through the assembly compared to an assembly having magnetic material on only one side of the assembly, such as on the assembly back side adjacent leadframe 152 opposite magnetic field sensor die 158. The reduced x-component magnetic field prevents saturation of magnetic field sensitive elements 160.

Figure 4:
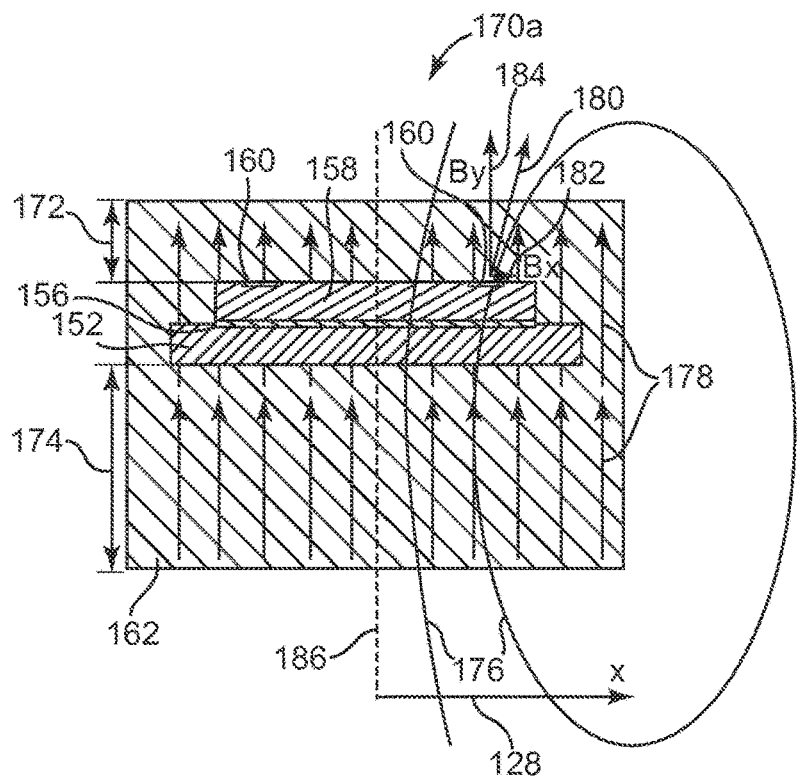
FIG. 4 illustrates a cross-sectional view of another embodiment of a magnetic field sensor.

FIG. 4 illustrates a cross-sectional view of another embodiment of a magnetic field sensor 170a. In one embodiment, magnetic field sensor 170a provides magnetic field sensor 106 previously described and illustrated with reference to FIG. 1. In one embodiment, magnetic field sensor 170a is configured to be used with a permeable tooth wheel, such as permeable tooth wheel 120 previously described and illustrated with reference to FIG. 2. In one embodiment, magnetic field sensor 170a is an integrated circuit or part of an integrated circuit.

Magnetic field sensor 170a includes a leadframe 152, pins (not shown), a magnetic field sensor die 158 including magnetic field sensitive elements 160, bond wires (not shown), and injection molded magnetic material 162. Magnetic field sensitive elements 160 are fabricated in magnetic field sensor die 158. In one embodiment, magnetic field sensitive elements 160 are formed on the surface of magnetic field sensor die 158. Magnetic field sensitive elements 160 include hall sensor elements, XMR sensor elements, or other suitable magnetic field sensitive elements. Magnetic field sensor die 158 is attached to leadframe 152 through die bond 156. Magnetic field sensor die 158 is electrically coupled to the pins through the bond wires.

Injection molded magnetic material 162 encloses the assembly provided by leadframe 152, magnetic field sensor die 158, the bond wires, and portions of the pins. Injection molded magnetic material 162 provides a plastic bonded magnet as previously described with reference to FIGS. 3A and 3B. Magnetic material is injected into a cavity around the assembly to provide injection molded magnetic material 162 having a first thickness 172 on the front side of the assembly and a second thickness 174 on a back side of the assembly. In one embodiment, the first thickness 172 is less than the second thickness 174.

Injection molded magnetic material 162 is magnetized perpendicular to magnetic field sensor die 158 as indicated by arrows 178. The magnetization of injection molded magnetic material 162 provides flux lines 176 that diverge away from a center line 186 of injection molded magnetic material 162. On the right side of centerline 186, the flux lines diverge in the positive x-direction 128. On the left side of centerline 186, the flux lines (not shown) diverge in the opposite or negative x-direction 128.

Injection molded magnetic material 162 generates a magnetic field as indicated at 180 at magnetic field sensitive elements 160. Magnetic field 180 includes a y-component (By) 184 and an x-component (Bx) 182. The y-component By 184 is substantially equal at the magnetic field sensitive element 160 to the right of centerline 186 and at the magnetic field sensitive element 160 to the left of centerline 186. The x-component Bx 182 at the magnetic field sensitive element 160 to the right of centerline 186 is positive and the x-component Bx 182 at the magnetic field sensitive element 160 to the left of centerline 186 is negative.

Thickness 174 of injection molded magnetic material 162 is set to accumulate a suitable amount of magnetic moment. Thickness 172 of injection molded magnetic material 162 is set to adjust the x-component Bx 182 at magnetic field sensitive elements 160 to a suitable value. The x-component Bx 182 at magnetic field sensitive elements 160 should be small enough such that magnetic field sensitive elements 160 are not saturated. In addition, thickness 172 of injection molded magnetic material 162 is set to adjust the effective air gap between magnetic field sensitive elements 160 and a permeable tooth wheel to a suitable value. The effective air gap should be small enough such that a suitable signal swing is provided by magnetic field sensitive elements 160.

As thickness 172 of injection molded magnetic material 162 increases, the effective air gap increases and the x-component Bx 182 decreases. As thickness 172 of injection molded magnetic material 162 decreases, the effective air gap decreases and the x-component Bx 182 increases. Therefore, thickness 172 of injection molded magnetic material 162 is selected to provide a suitable balance between the effective air gap and the x-component Bx 182.

Figure 5:
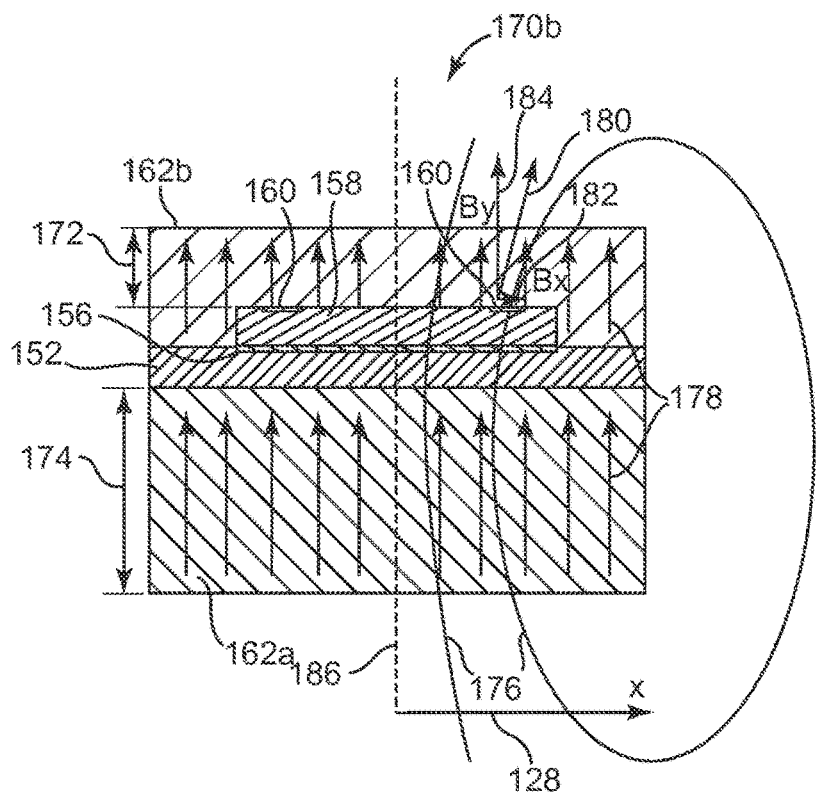
FIG. 5 illustrates a cross-sectional view of another embodiment of a magnetic field sensor.

FIG. 5 illustrates a cross-sectional view of another embodiment of a magnetic field sensor 170a. Magnetic field sensor 170b is similar to magnetic field sensor 170a previously described and illustrated with reference to FIG. 4, except that magnetic field sensor 170b includes a first injection molded magnetic material 162a and a second injection molded magnetic material 162b in place of injection molded magnetic material 162 of magnetic field sensor 170a.

In this embodiment, first injection molded magnetic material 162a has a first remanence and second injection molded magnetic material 162 b has a second remanence. The first remanence of first injection molded magnetic material 162a is less than the second remanence of second injection molded magnetic material 162 b. Therefore, thickness 172 of second injection molded magnetic material 162 b can be reduced with respect to thickness 174 of first injection molded magnetic material 162a to reduce the effective air gap while simultaneously reducing the x-component Bx 182. The minimal value for x-component Bx 182 is obtained when thickness 174 of first injection molded magnetic material 162a times the first remanence equals thickness 172 of second injection molded magnetic material 162 b times the second remanence. With these values for thickness 172 and thickness 174, flux lines 176 pass substantially perpendicularly through magnetic field sensor die 158.

In one embodiment, first injection molded magnetic material 162a and second injection molded magnetic material 162 b include different magnetic materials. In another embodiment, first injection molded magnetic material 162a and second injection molded magnetic material 162 b include the same magnetic material but in different concentrations. For example, in one embodiment, first injection molded magnetic material 162a may include $Sm_2Co_{17}$ grade 18/100p with 340 mT remanence and second injection molded magnetic material 162 b may include $Sm_2Co_{17}$ grade 45/100p with 540 mT remanence.

Figure 6:
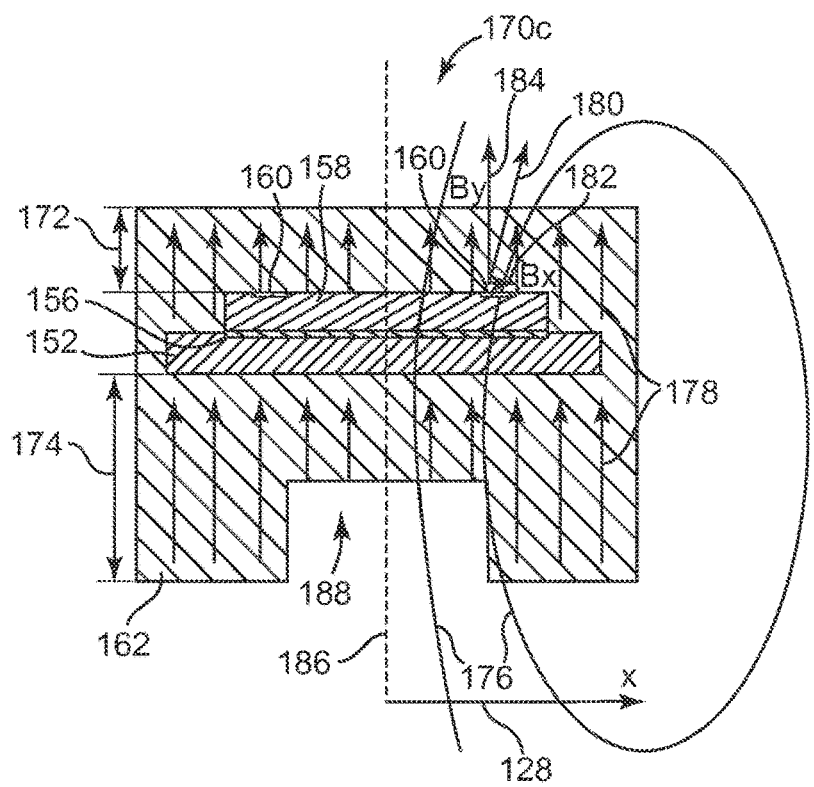
FIG. 6 illustrates a cross-sectional view of another embodiment of a magnetic field sensor.

FIG. 6 illustrates a cross-sectional view of another embodiment of a magnetic field sensor 170c. Magnetic field sensor 170c is similar to magnetic field sensor 170a previously described and illustrated with reference to FIG. 4, except that magnetic field sensor 170c includes an opening or recess 188 in injection molded magnetic material 162 adjacent the back side of leadframe 152. Recess 188 in injection molded magnetic material 162 is centered on centerline 186. Recess 188 adjusts flux lines 176 to reduce the x-component Bx 182 while maintaining the effective air gap set by thickness 172 of injection molded magnetic material 162.

Figure 7:
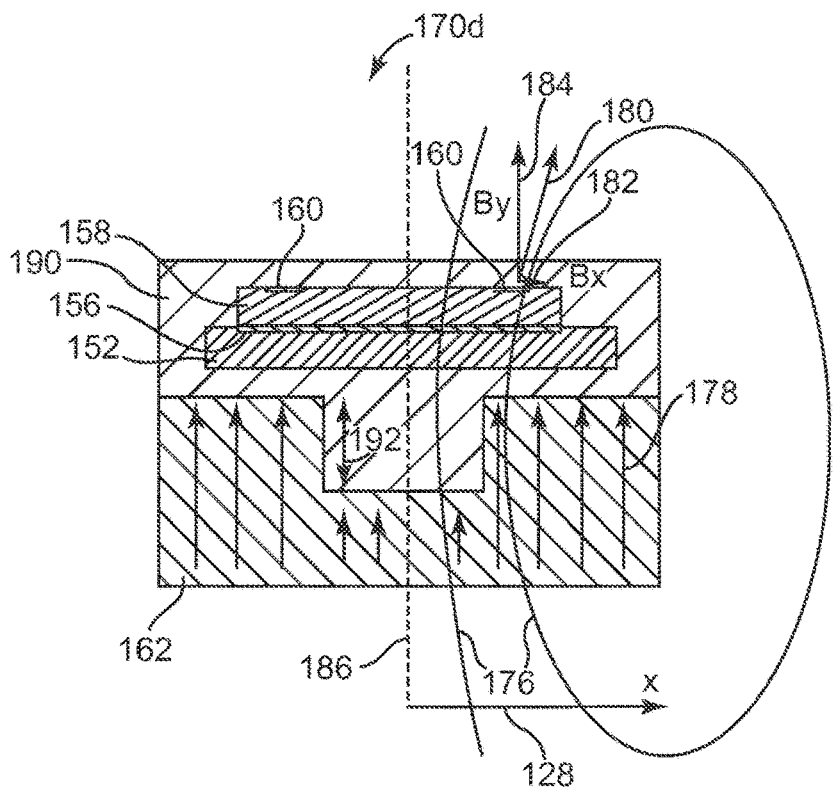
FIG. 7 illustrates a cross-sectional view of another embodiment of a magnetic field sensor.

FIG. 7 illustrates a cross-sectional view of another embodiment of a magnetic field sensor 170d. Magnetic field sensor 170d is similar to magnetic field sensor 170a previously described and illustrated with reference to FIG. 4, except that magnetic field sensor 170d includes a injection molded plastic material 190 in addition to injection molded magnetic material 162.

In one embodiment, injection molded plastic material 190 is similar to injection molded materials used for plastic encapsulated microcircuits (PEMs). Injection molded plastic material 190 includes a filler, such as quartz flour, and an epoxy binder, such as 0-Cresol Novolac (OCN), Biphenyl, Di Cyclo Penta Diene (DCPD), a multi-aromatic resin, or other suitable material. In one embodiment, the quartz flour has particles sizes within a range of approximately 10 µm-30 µm and provides approximately 70%-90% by weight of injection molded plastic material 190. The filler content is maximized to reduce the coefficient of thermal expansion (CTE) of the injection molded plastic material to a value between approximately 10 ppm/° C.-17 ppm/° C. The CTE of injection molded plastic material 190 is between the CTE of silicon, which is 2.3 ppm/° C., and the CTE of leadframe 152, which in one embodiment is approximately 17 ppm/° C. depending on the exact alloy composition used.

In one embodiment, the CTE of injection molded magnetic material 162 is within the range of the CTE of injection molded plastic material 190. The specific electrical resistance for injection molded plastic material 190 is on the order of $10^9$ Ohm*m, whereas the specific electrical resistance is on the order of $10^{-6}$ Ohm*m for pure rare earth magnets and greater than $10^{-2}$ Ohm*m for pure ferrites. For injection molded magnetic material 162, the specific electrical resistance increases by about three orders of magnitude over the pure rare earth magnets or the pure ferrites. Therefore, injection molded magnetic material 162 provides less electrical insulation than injection molded plastic material 190. To improve electrical isolation within a magnetic field sensor, the bond wires and bond pads may be covered by an insulation material after the bonding process or a two component injection molding technique may be used. In this embodiment, a two component injection molding technique is used to fabricate magnetic field sensor 170d.

With the two component injection molding technique, a first type of mold compound (e.g., a plastic mold material) is injected into a first cavity. After the mold compound solidifies, a second type of mold compound (e.g., a magnetic mold material) is injected into a second cavity that is larger than the first cavity and includes the first cavity. In one embodiment, the second mold compound is attached to the first mold compound and/or partly surrounds the first mold compound. If the first and second mold compounds have similar melting points, a chemical bond may be formed between the first and second mold compounds to surface fuse the first and second mold compounds. If the first and second mold compounds have dissimilar melting points, the first and second mold compounds should have a mechanical bond to hold the first and second mold compounds together.

The two component injection molding technique reduces tolerances and provides better alignment between the individual sensor parts since the sensor assembly stays in place after the first injection mold process. The second mold material is attached to the first mold material with negligible position tolerances caused by the working tool itself, which is typically highly accurate.

In this embodiment, plastic material is injection molded around leadframe 152, magnetic field sensor die 158, the bond wires (not shown), and portion of the pins (not shown) to provide injection molded plastic material 190. Injection molded plastic material 190 includes an extended portion adjacent the back side of leadframe 152 having a thickness indicated at 192. The extended portion is centered on centerline 186. Magnetic material is injection molded onto injection molded plastic material 190 to provide injection molded magnetic material 162. Injection molded magnetic material 162 is surface fused to injection molded plastic material 190 through a chemical bond.

Due to the extended portion of injection molded plastic material 190, injection molded magnetic material 162 includes a corresponding recess. The recess has a depth as indicated at 192 and is centered on centerline 186. The recess of injection molded magnetic material 162 around centerline 186 adjusts flux lines 176 to reduce the x-component Bx 182. The x-component Bx 182 is reduced without providing any injection molded magnetic material 162 adjacent magnetic field sensor die 158.

Figure 8:
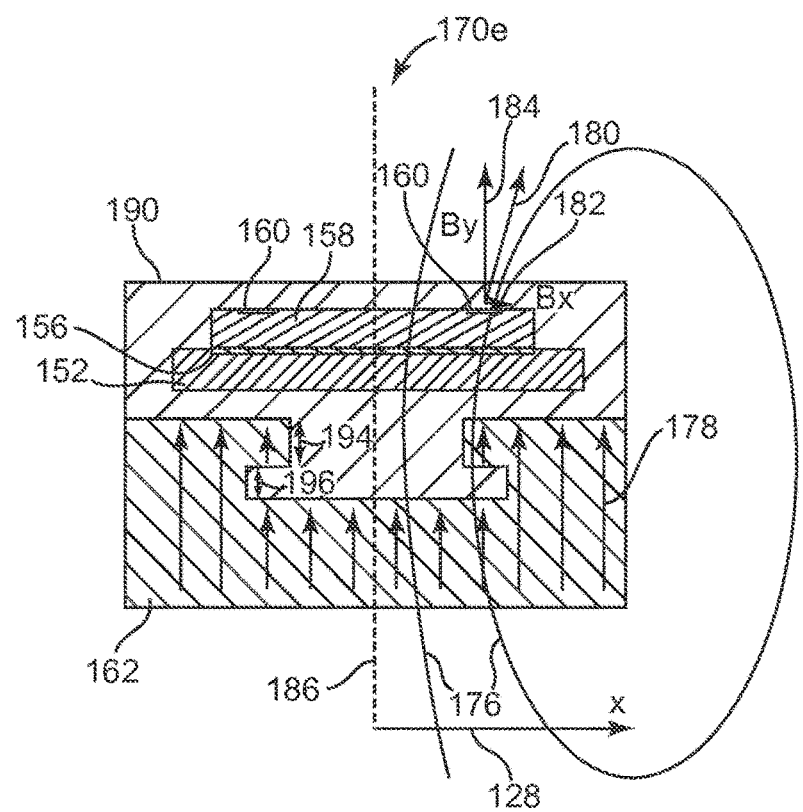
FIG. 8 illustrates a cross-sectional view of another embodiment of a magnetic field sensor.

FIG. 8 illustrates a cross-sectional view of another embodiment of a magnetic field sensor 1 70e. Magnetic field sensor 1 70e is similar to magnetic field sensor 1 70d previously described and illustrated with reference to FIG. 7, except that injection molded magnetic material 162 of magnetic field sensor 170e is mechanically bonded to injection molded plastic material 190. Injection molded plastic material 190 includes an extended portion adjacent the back side of leadframe 152 having a first portion indicated at 194 and a second portion indicated at 196. Second portion 196 is wider than first section 194 such that injection molded magnetic material 162 is mechanically locked in place to injection molded plastic material 190 by second portion 196. In one embodiment, injection molded magnetic material 162 is also chemically bonded to injection molded plastic material 190.

Figure 9:
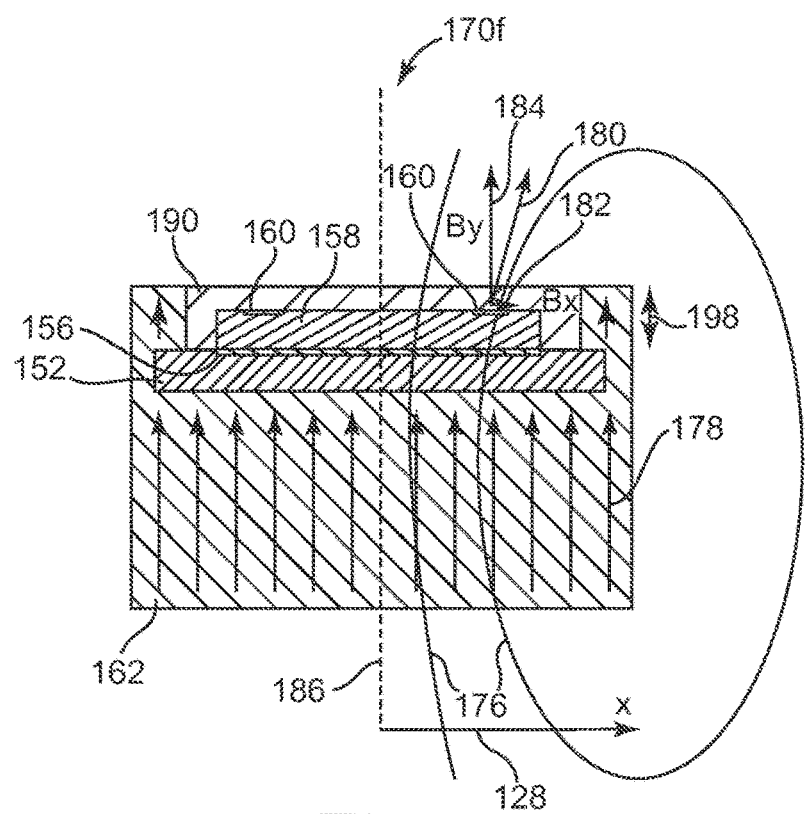
FIG. 9 illustrates a cross-sectional view of another embodiment of a magnetic field sensor.

FIG. 9 illustrates a cross-sectional view of another embodiment of a magnetic field sensor 170f. Magnetic field sensor 170f is similar to magnetic field sensor 170a previously described and illustrated with reference to FIG. 4, except that magnetic field sensor 170f includes injection molded plastic material 190 over magnetic field sensor die 158. In this embodiment, injection molded magnetic material 162 is mechanically bonded to leadframe 152 by extending around to a portion of the front side of leadframe 152 as indicated at 198 while covering the back side of leadframe 152.

Figure 10:
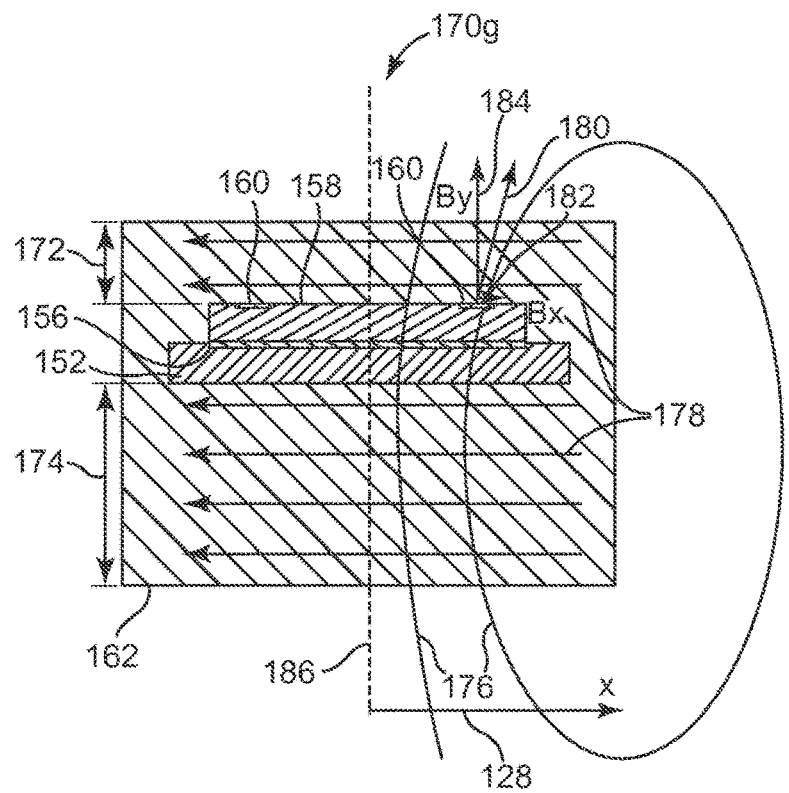
FIG. 10 illustrates a cross-sectional view of another embodiment of a magnetic field sensor.

FIG. 10 illustrates a cross-sectional view of another embodiment of a magnetic field sensor 170g. Magnetic field sensor 1 70g is similar to magnetic field sensor 1 70a previously described and illustrated with reference to FIG. 4, except that injection molded magnetic material 162 of magnetic field sensor 1 70g is magnetized in the negative x-direction 128 as indicated by arrows 178. In other embodiments, injection molded magnetic material 162 is magnetized in any suitable direction.

Figure 11:
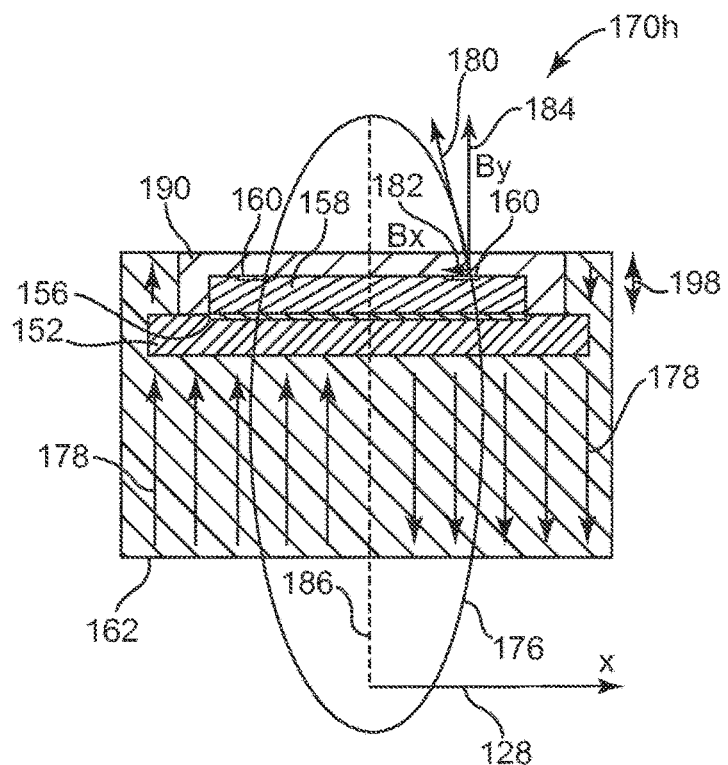
FIG. 11 illustrates a cross-sectional view of another embodiment of a magnetic field sensor.

FIG. 11 illustrates a cross-sectional view of another embodiment of a magnetic field sensor 1 70h. Magnetic field sensor 1 70h is similar to magnetic field sensor 170f previously described and illustrated with reference to FIG. 9, except that injection molded magnetic material 162 of magnetic field sensor 170h has multipolar magnetization as indicated by arrows 178. In one embodiment, injection molded magnetic material 162 is magnetized in the positive y-direction to the left of centerline 186 and magnetized in the negative y-direction to the right of centerline 186. In this embodiment, flux lines 176 are centered around centerline 186. Therefore, the x-component Bx 182 at the magnetic field sensitive element 160 to the right of centerline 186 is negative and the x-component Bx 182 at the magnetic field sensitive element 160 to the left of centerline 186 is positive.

Figure 12:
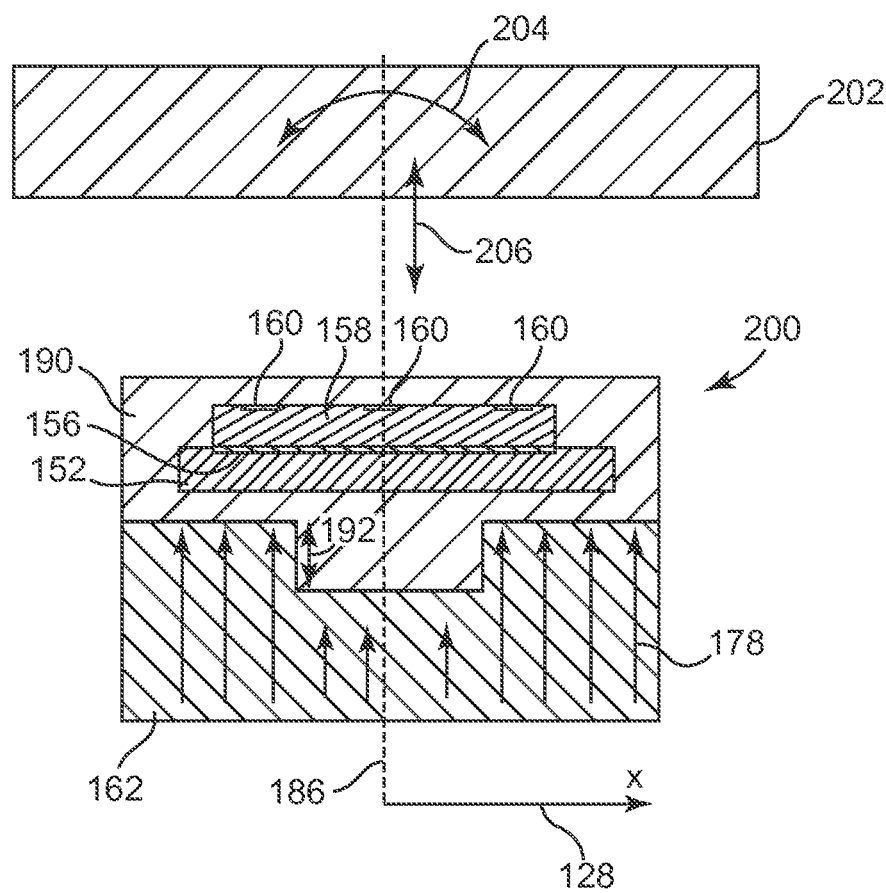
FIG. 12 illustrates a cross-sectional view of another embodiment of a magnetic field sensor.

FIG. 12 illustrates a cross-sectional view of another embodiment of a magnetic field sensor 200. Magnetic field sensor 200 is similar to magnetic field sensor 1 70d previously described and illustrated with reference to FIG. 7, except that magnetic field sensor 200 includes an additional magnetic field sensitive element 160 on the centerline 186. Magnetic field sensor 200 is configured to detect vertical movement as indicated at 206 and/or angular movement as indicated at 204 of a ferrous or other suitable part 202. In response to a change in the vertical distance between magnetic field sensor 200 and part 202, the flux density on magnetic field sensitive element 160 on the centerline 186 changes. In response to a change in the angular position of part 202 with respect to magnetic field sensor 200, the ratio of flux on the left and right magnetic field sensitive elements 160 changes. In one embodiment, the changes in flux are sensed and compared to a threshold value to use magnetic field sensor 200 as a switch.

Figure 13:
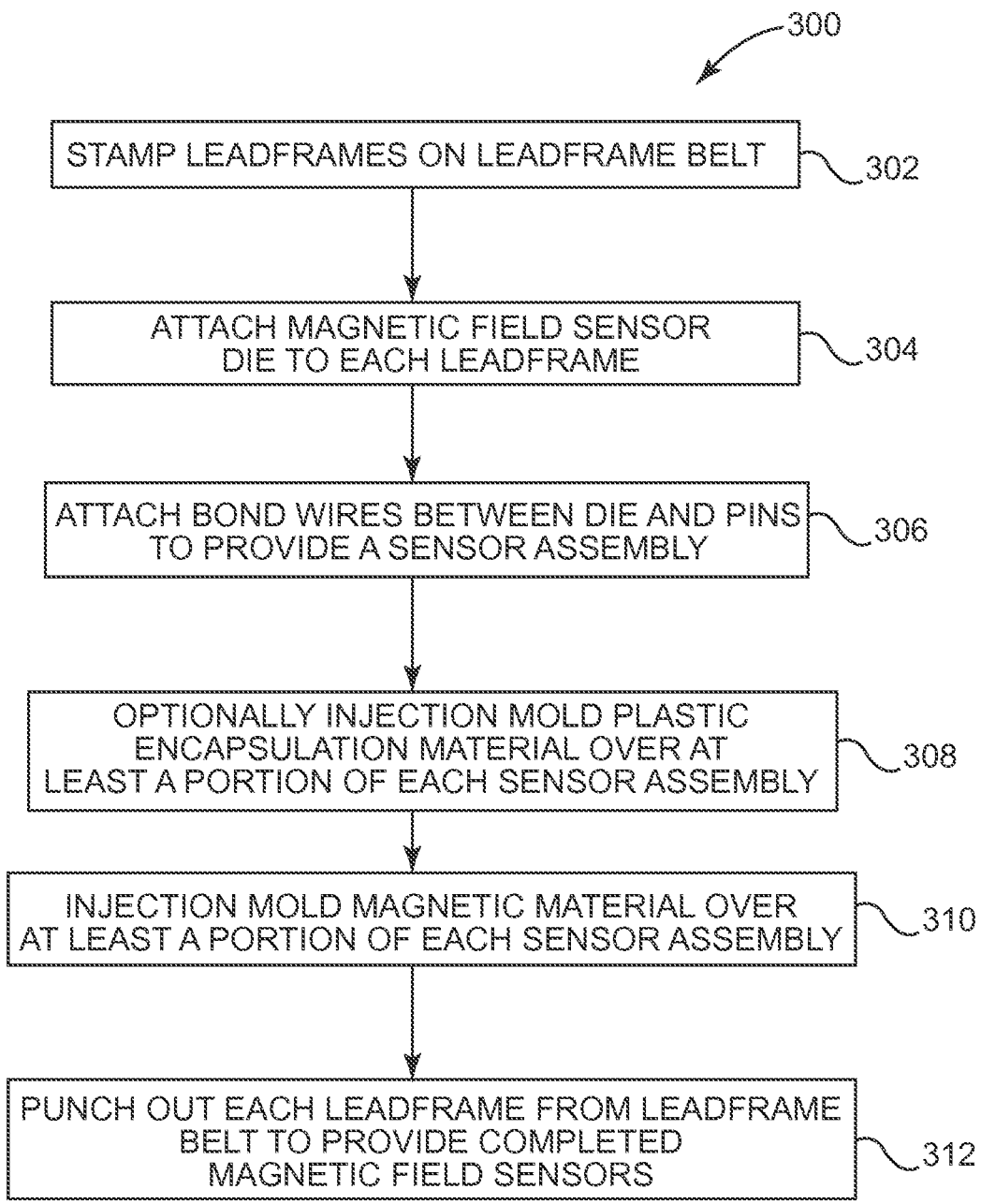
FIG. 13 is a flow diagram illustrating one embodiment of a method for fabricating a magnetic field sensor.

FIG. 13 is a flow diagram illustrating one embodiment of a method 300 for fabricating a magnetic field sensor including an injection molded magnetic material. At 302, leadframes including pins are stamped on a leadframe belt. At 304, magnetic field sensor die are attached to each leadframe. At 306, bond wires are bonded between the magnetic field sensor die and pins to provide a sensor assembly. At 308, a plastic encapsulation material is optionally injection molded around at least a portion of each sensor assembly. At 310, a magnetic material is injection molded around at least a portion of each sensor assembly. At 312, each leadframe is punched out from the leadframe belt and the magnetic material is magnetized to provide completed magnetic field sensors.

Embodiments provide magnetic field sensors including injection molded magnetic material. The injection molded magnetic material replaces permanent magnets used in typical magnetic field sensors. The injection molded magnetic material can be configured to provide desired magnetic field sensor properties. In addition, by injection molding the magnetic material, the fabrication and testing processes for the magnetic field sensors is improved compared to typical magnetic field sensors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a magnetic field sensor;
a first injection molded magnetic material on a first side of the magnetic field sensor and having a first thickness and a first remanence; and
a second injection molded magnetic material on a second side of the magnetic field sensor opposite the first side and having a second remanence greater than the first remanence and a second thickness less than the first thickness, wherein the second thickness is based on the second remanence, the first thickness, and the first remanence.

2. The integrated circuit of claim 1, wherein the first injection molded magnetic material and the second injection molded magnetic material collectively enclose the magnetic field sensor.

3. The integrated circuit of claim 1, wherein the second thickness is selected to adjust a magnetic field component at the magnetic field sensor in a first direction perpendicular to a magnetized direction of the second injection molded magnetic material.

4. The integrated circuit of claim 3, wherein the first injection molded magnetic material is magnetized in the magnetized direction.

5. The integrated circuit of claim 1, wherein a product of the first remanence and the first thickness is related to a product of the second thickness the second remanence.

6. The integrated circuit of claim 1, wherein a product of the first remanence and the first thickness is equal to a product of the second thickness the second remanence.

7. The integrated circuit of claim 1, wherein the first injection molded magnetic material has a uniform thickness.

8. The integrated circuit of claim 1, wherein the second injection molded magnetic material directly contacts the magnetic field sensor.

9. The integrated circuit of claim 8, wherein the second injection molded magnetic material contacts the magnetic field sensor on three sides of the magnetic field sensor.

10. The integrated circuit of claim 1, wherein the first and the second injection molded magnetic materials each comprise an injection moldable magnetic material that is configured to be injection molded.

11. A method for fabricating an integrated circuit, the method comprising:
providing a magnetic field sensor;
injection molding a first magnetic material having a first thickness and a first remanence over a first side of the magnetic field sensor; and
injection molding a second magnetic material having a second thickness and a second remanence over a second side of the magnetic field sensor opposite the first side, wherein the second remanence is greater than the first remanence and the second thickness is less than the first thickness, the second thickness being based on the second remanence, the first thickness, and the first remanence.

12. The method of claim 11, wherein the second thickness is selected to adjust a magnetic field component at the magnetic field sensor in a first direction perpendicular to a magnetized direction of the second injection molded magnetic material.

13. The method of claim 12, wherein the first injection molded magnetic material is magnetized in the magnetized direction.

14. An integrated circuit, comprising:
a magnetic field sensor comprising a die;
a first injection molded magnetic material having a first thickness and a first remanence on a first side of the die; and
a second injection molded magnetic material on a second side of the die opposite the first side, the second injection molded magnetic material having a second thickness less than the first thickness, and a second remanence greater than the first remanence wherein the second thickness is based on the second remanence, the first thickness, and the first remanence.

15. The integrated circuit of claim 14, wherein a product of the first remanence and the first thickness is related to a product of the second thickness the second remanence.

16. The integrated circuit of claim 14, wherein a product of the first remanence and the first thickness is equal to a product of the second thickness the second remanence.

17. The integrated circuit of claim 14, wherein the first injection molded magnetic material has a uniform thickness.

18. The integrated circuit of claim 14, wherein the second injection molded magnetic material directly contacts the magnetic field sensor.

19. The integrated circuit of claim 18, wherein the second injection molded magnetic material contacts the magnetic field sensor on three sides of the magnetic field sensor.

20. The integrated circuit of claim 18, wherein the first injection molded magnetic material directly contacts the die.

* * * * *